(12) United States Patent
Brown et al.

(10) Patent No.: US 7,203,886 B2
(45) Date of Patent: Apr. 10, 2007

(54) DETECTING AND CORRECTING CORRUPTED MEMORY CELLS IN A MEMORY

(75) Inventors: Michael A. Brown, Phoenix, AZ (US); Richard L. Coulson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 392 days.

(21) Appl. No.: 10/112,835

(22) Filed: Mar. 27, 2002

(65) Prior Publication Data

US 2003/0188251 A1 Oct. 2, 2003

(51) Int. Cl.
*H03M 13/00* (2006.01)
(52) U.S. Cl. .................. 714/758; 714/763
(58) Field of Classification Search .............. 714/6, 714/710, 764, 763, 704, 718, 758
See application file for complete search history.

(56) References Cited

U.S. PATENT DOCUMENTS

| | | | |
|---|---|---|---|
| 4,608,687 A * | 8/1986 | Dutton | 714/710 |
| 5,313,464 A | 5/1994 | Reiff | |
| 5,343,426 A | 8/1994 | Cassidy et al. | |
| 5,452,429 A * | 9/1995 | Fuoco et al. | 714/6 |
| 5,559,956 A * | 9/1996 | Sukegawa | 714/8 |
| 5,784,548 A * | 7/1998 | Liong et al. | 714/6 |
| 6,349,390 B1 * | 2/2002 | Dell et al. | 714/6 |
| 6,442,726 B1 * | 8/2002 | Knefel | 714/763 |
| 6,697,976 B1 * | 2/2004 | Satoh et al. | 714/704 |
| 6,715,116 B2 * | 3/2004 | Lester et al. | 714/718 |

OTHER PUBLICATIONS

Cipra, Barry, "The Ubiquitous Reed-Solomon Codes," SIAM News, vol. 26, No. 1, Jan. 1993, http://www.siam.org/siamnews/mtc/mtc193.htm (3 pages).
Reed-Solomon Codes, http://www.4i2i.com/reed_solomon_codes.htm, (7 pages).
Safari, Ahmad; Panda, K. Rajesh; Janas, Victor F.; "Ferroelectric Ceramics: Processing, Properties & Applications" (Dept. of Ceramic Science and Engineering, Rutgers University, Piscataway NJ 08855, USA) www.rci.rutgers.edu/~ecerg/projects/ferroelectric.html (50 pages).

* cited by examiner

*Primary Examiner*—Albert Decady
*Assistant Examiner*—Mujtaba Chaudry
(74) *Attorney, Agent, or Firm*—Marger Johnson & McCollom, PC

(57) ABSTRACT

A data storage comprises memory having a plurality of memory cells operative to retain data until read. A buffer cooperates, under the control of an address and buffer manager, with the memory to receive data read from the memory cells of a plurality of memory blocks of the memory. Error correction logic is operatively configured to examine the data read from the memory blocks and determine and correct corrupt data thereof. After the data has been processed by the error correction logic, the address and buffer manager enables write circuitry to write-back the select blocks of memory cells with the processed data of the buffer.

13 Claims, 10 Drawing Sheets

DETECTING AND CORRECTING CORRUPTED MEMORY CELLS IN A MEMORY

BACKGROUND

Computer systems employ a variety of memory, including magnetic disk and semiconductor memory systems. Typically, magnetic disk storage systems target large memory, low speed applications; whereas, semiconductor storage systems target high-speed, low capacity applications. However, with semiconductor devices becoming less expensive and offering greater capacities, the computer industry has begun using solid-state disk storage systems to provide large, "disk-like" storage capacity with fast, "solid-state-like" speed of performance.

Known, exemplary solid-state disk drives comprise a plurality of DRAM or FLASH memory chips. In general, the DRAM chips are used for storing data temporarily, and the FLASH chips used for more permanent data retention. To improve their data storage reliability, the solid-state disk drives may incorporate error correction logic for overcoming possible soft-error limitations, or perhaps a failed device from amongst the plurality of chips that may make-up the solid-state disk drive.

Error correction coding (ECC) circuits may encode data for storage and decode the data when read therefrom. Known ECC circuits, for example Reed-Solomon, may work with a codeblock, or codeword, that comprises a plurality of symbols (data bit groups). When employed with a solid-state disk that comprises a plurality of discrete memory chips, the ECC circuits may employ interleaved symbol techniques for distribution of the data of the ECC codeblock across the plurality of memory chips of the solid-state disk. Additionally, the error correction code (ECC) may provide a sufficient length error correction capability, such that a failure of one or more memory chips from amongst the plurality of chips may be accommodated with correction by the ECC without exhausting its correction length.

DRAM or FLASH devices are exemplary forms of memory of known solid-state disks. Such memory chips exchange their data in small bytes—i.e., using word oriented data transfers. Therefore, ECC circuits and methods of known, exemplary solid-state disks may include symbol-to-word, interleave converters that convert the ECC codeblock symbols into pre-formatted words that may be written into and across the separate memory chips of the solid-state disk. Likewise, when reading data, conversion circuits may receive data words from the plurality of memory chips, convert the received words into symbols of an ECC codeblock for processing by ECC circuitry.

DRAM memory is a volatile form of memory. When in use, the device periodically refreshes its memory contents internally to assure data retention. However, being a volatile device, the DRAM loses data with loss of power. Accordingly, such DRAM's are known for temporary data storage applications, wherein new information is typically obtained and provided over the course of its operation.

On the other hand, non-volatile memories, e.g., FLASH or EEPROM, are known to provide long-term data retention. Once they have been programmed with data, the non-volatile devices may be expected to retain their data with high reliability and low error rate.

As the geometries of DRAM and FLASH devices decrease, their probability of experiencing a random or soft-error during a read operation may increase, which in-turn may add additional demands to the error correction methods. Recently, some memory manufactures have been directing their attention to alternative non-volatile memories, such as magneto-resistive, ferro-magnetic, and ferro-electric memory devices. Such alternatives may offer enhanced memory capacities with densities not previously practical in planar DRAM and FLASH technologies. For example, some ferroelectric designs may stack arrays of ferroelectric memory cells. However, for some of these memories, for example, ferroelectric, the memory may fatigue over an extended use and time. Additionally, the ferroelectric memories may employ a destructive read procedure wherein the state of a memory cell is cleared by its read process. Further, the ferroelectric memories may enable enhanced capacities with provision of stacking of the layers of cells in 3-D fashion, which capacities have not been practical in planar DRAM and FLASH technologies. Memory technologies and densities have evolved to the point that an individual memory chip may contain the equivalent of multiple previous generation memory chips. This may include repetitive implementations of the address decoders, memory blocks, multiplexers and sense amplifiers. The evolution of memory cell density, addressing schemes and the introduction of new memory storage materials requires the revisiting of the architecture of fundamental memory building blocks, the integrated circuit. Such architectural partitioning considerations may influence the redundancy circuits and allow isolation of high risk areas for the components and circuits that may be associated with memory arrays.

BRIEF DESCRIPTION OF THE DRAWINGS

The invention may be best understood by reading the disclosure with reference to the accompanying drawings, wherein.

DETAILED DESCRIPTION

Figure 1:
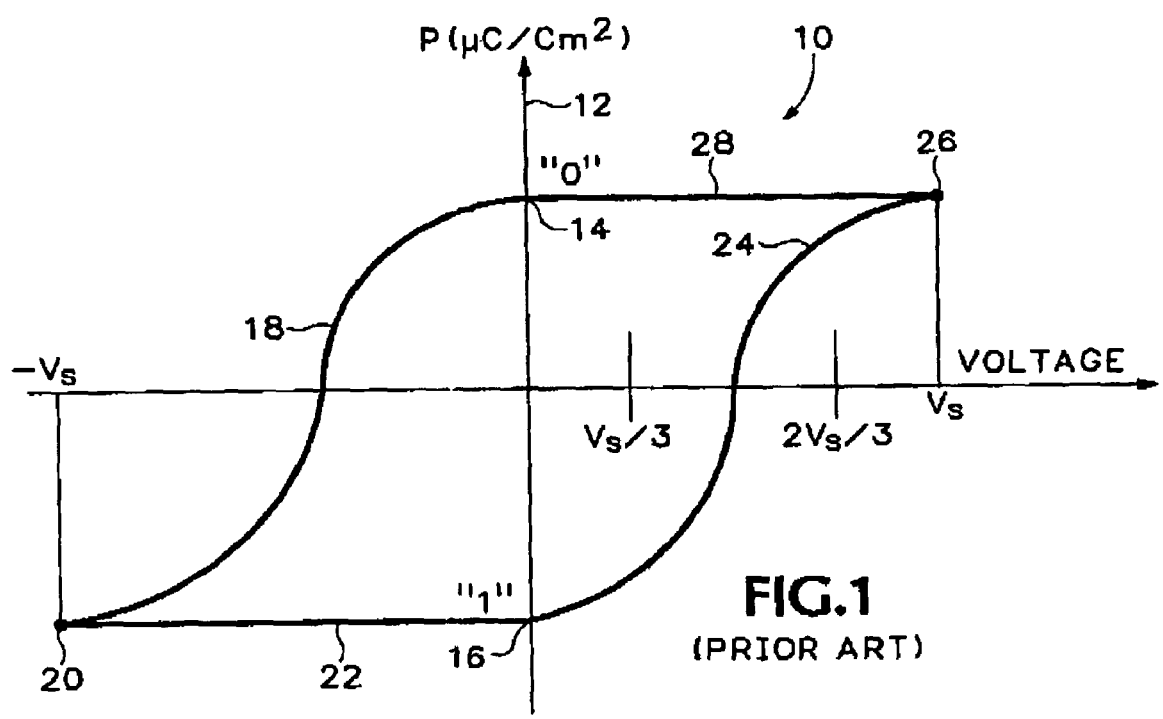
FIG. 1 is a graph schematically illustrating a polarization versus voltage hysteresis curve for a ferroelectric cell.

For a known ferroelectric memory cell, a polarization alignment thereof characterizes its stored data state. As illustrated by the polarization versus voltage hysteresis curve 10 of FIG. 1, the cells hysteresis curve 10 crosses vertical axis 12 at two locations 14, 16 representative of the "0" (zero) and "1" (one) storage states. In operation, application of a negative voltage $-V_s$ to the ferroelectric cell sets the cell's polarization to a negative orientation (following path 18 of curve 10 to position 20) for storing a "one" state. Upon removing the applied voltage, a negative orientation may remain (path 22 to position 16). Thereafter, application of a positive voltage $V_s$ may reverse the cell's polarization state (path 24 to position 26), which "one" to "zero" polarization reversal may be accompanied by a charge release. In contrast, a cell of a zero state does not provide such a charge release upon application of $V_s$ (path 28 to position 26). This difference in the released charge between the "one" and "zero" states may provide the basis for reading a ferroelectric cell—i.e., applying a voltage to the cell and monitoring for released charge. However, because reading the ferroelectric cell is typically destructive, meaning that the read operation may clear the one state to a zero state, the read operation is typically followed with a write-back operation to rewrite the data of the ferroelectric cell. As used herein, the assignment of the "zero" and "one" states is arbitrary and shall have no impact on the claims herein.

Exemplary, known ferroelectric memories may have destructive read procedures wherein data may be cleared when read. For such memory, a write-back may restore its data for continued retention. As recognized herein, such known write-back may result in soft-error accumulations within the memory. For example, assuming an alpha-particle disturbance during a read operation, such disturbance might effect a random "soft" error. A write-back of the resulting bad data bit effected by the random error may then allow the soft-error to stick or persist. To address such exemplary problem, in accordance with a particular embodiment of the present invention, a ferroelectric memory read process may employ an error correction process before performing a data write-back.

When writing data into the memory, a controller may sequence the contents of a buffer for transferring its data bits in a coordinated fashion into sequentially addressed, memory block locations of the memory. More specifically, after conditioning the data with ECC-encoding, an address and buffer manager may drive the buffer to transfer the processed data into symbol locations of various memory blocks of the memory, so as to organize the symbols within the memory block in a symbol interleaved format. The address and buffer manager and other routing circuitry together coordinate the interleaved symbol transfer into the various memory block regions of memory. Accordingly, when a damaged region or block of memory (or alternatively, a portion of an address decoder or memory sense circuits that affects a defined region of the memory) may be corrupted, the symbols of the ECC codeblock that are obtained from other functional blocks or regions of the memory permit ECC processing to overcome and correct the bad data of the corrupted region.

Although, particular exemplary embodiments of the present invention are described with reference to ferroelectric devices; alternative embodiments of the present invention include use of memory types other than ferroelectric, which memory types employ read processes that disturb their stored contents and/or require write-back processes for continued data retention. Additionally, other embodiments of the present invention would be directed to memory technologies having a non-destructive read procedure, but subject to a high soft error rate. Additionally, certain exemplary embodiments of the present invention may be applied to a memory technology that uses a non-destructive read, but could be subject to a high hard error rate at the functional block level.

Figure 2:
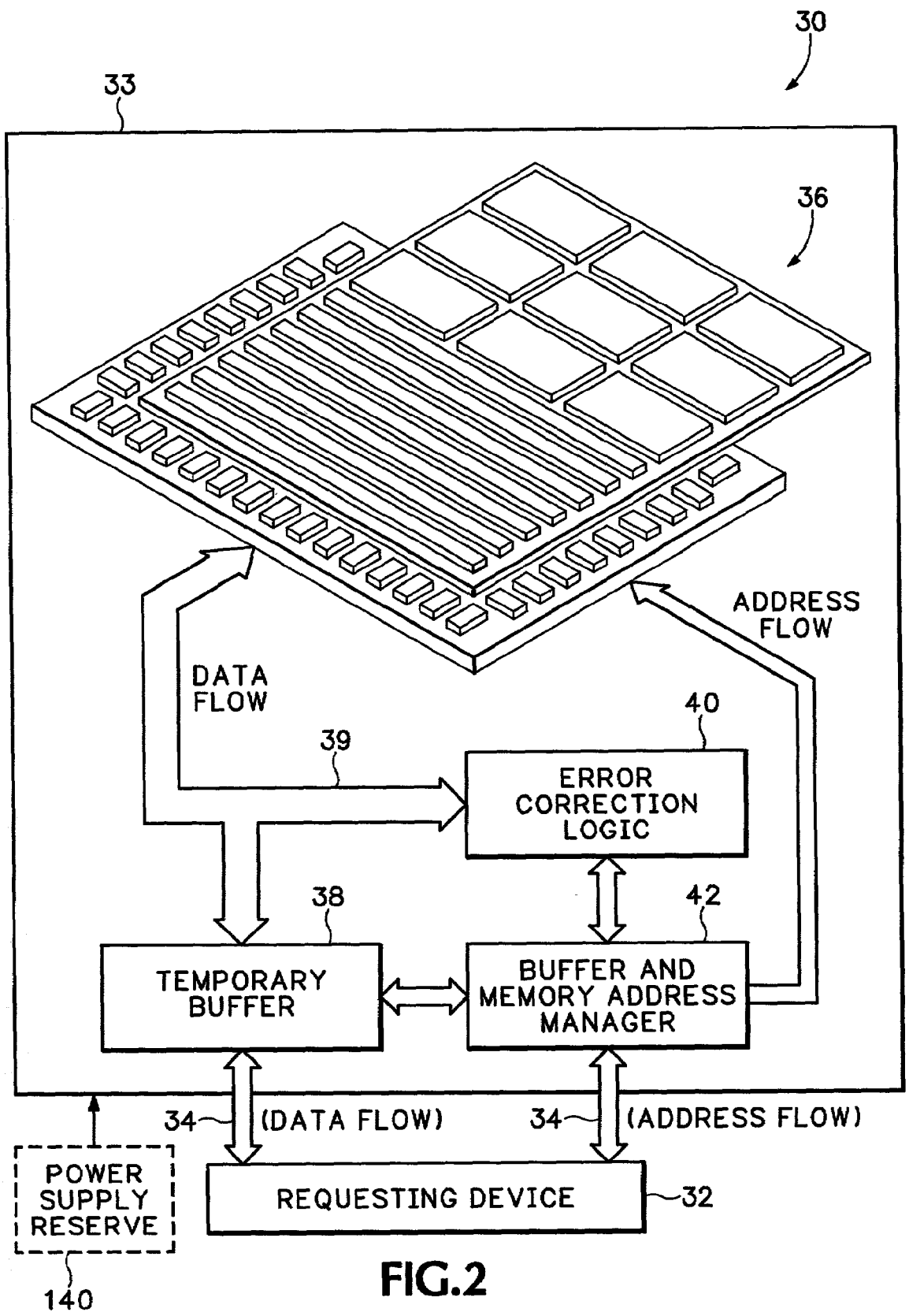
FIG. 2 is a simplified schematic block diagram of a data processing system with data storage in accordance with another exemplary embodiment of the present invention.

Referencing FIG. 2, in accordance with a particular embodiment of the present invention, processing system 30 comprises requesting device 32, such as for example a CPU, attached to data storage 33 by way of bus 34. Bus 34 may transfer information between requesting device 32 and data storage 33. In accordance with particular exemplary embodiments, data storage 33 may serve as a cache, disk or as an alternative storage device for processing system 30. Data storage 33 may be referred to, alternatively, as a "solid-state-disk", a sector, data block structured memory device.

Figure 3:
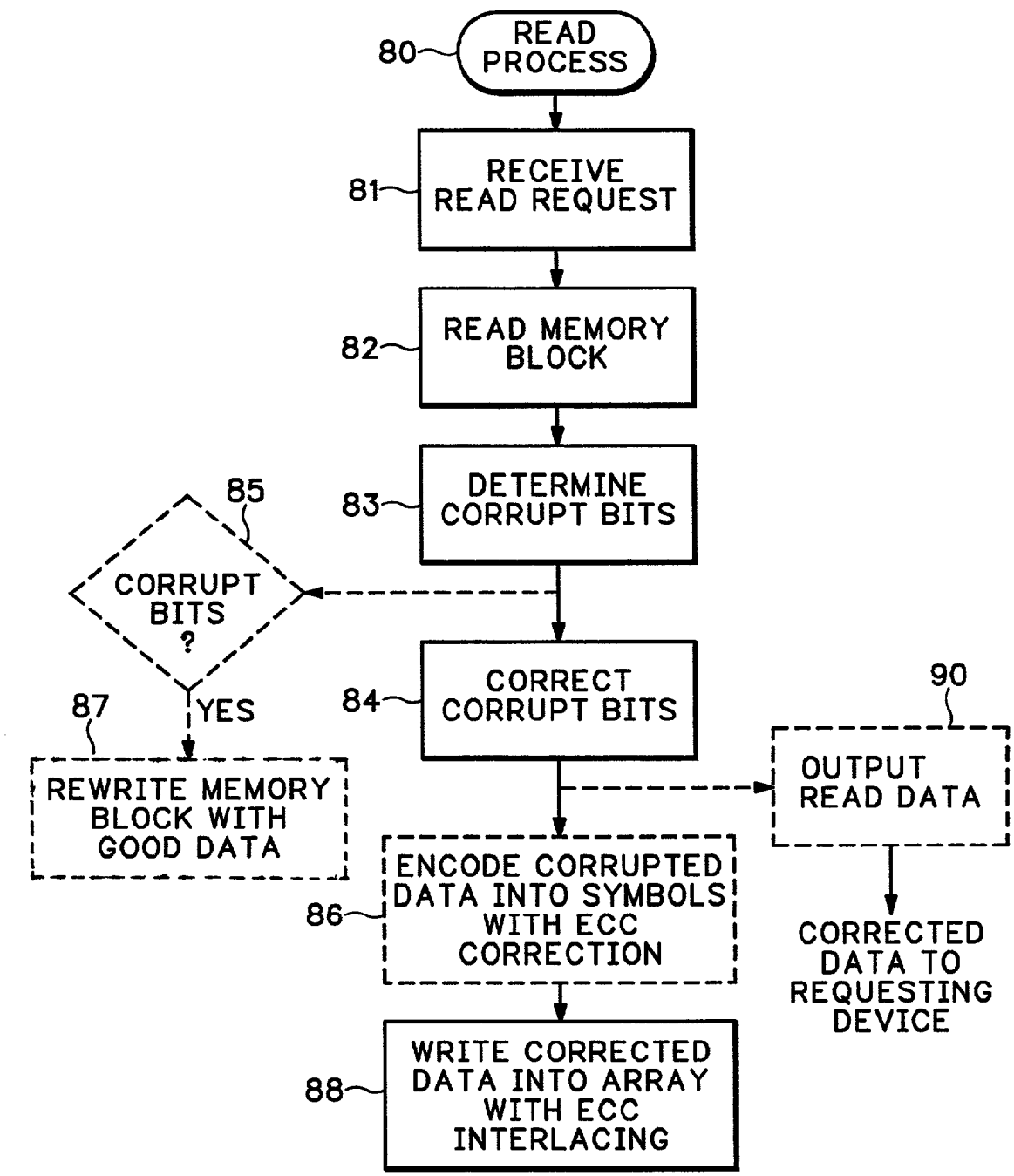
FIG. 3 is a flowchart illustrating read processes in accordance with exemplary embodiments of the present invention.

During an exemplary read process 80, continuing with reference to FIGS. 2 and 3, address and buffer manager 42 may receive a read request 81 together with an address from requesting device 32 by way of bus 34. The address may identify a select location of memory 36 of data storage 33 from which to retrieve data. In response to the read request, address and buffer manager 42 may enable transfer 82 (FIG. 3) of a data block (e.g., a sector of data) from the memory 36. The data block may provide data of a plurality of symbols for an error correction codeblock. Included in the data block from the memory for the error correction codeblock may be data of the select location of memory as requested.

Error correction logic 40 processes the data of the retrieved codeblock to determine 83 corrupt bits. In accordance with one embodiment of the present invention, a determination of corrupt bits 85 may trigger a re-write, wherein correct information may be obtained and the corrupted memory location re-written 87 with correct information. In a more specific exemplary embodiment, such re-write may be performed only when determining corrupt data bits (versus ECC data bits) of the memory. In another exemplary embodiment, ECC processing may correct 84 any corrupt bits and the corrected data may then be output 90 to the requesting device. Further, data of the ECC corrected codeblock from temporary buffer 38 is written back 88 into the memory 36.

In accordance with another alternative exemplary embodiment, ECC encoding 86 may be applied to the corrected data before the data write-back 88.

When sending out data, the corrected data is typically output 90 to the requesting device absent correction bits of the associate ECC algorithm. Alternatively, the output data may include the correction bits of the ECC encoding. During such output procedures, referencing FIG. 2, address and buffer manager 42 may coordinate operation of temporary buffer 38 for outputting the contents onto bus 34 for transfer to requesting device 32. It will be noted, for example, that under certain data transfer applications, wherein bus 34 might be vulnerable to noise, the data may be output with the correction bits.

When writing the corrected data back into memory 36, again as mentioned earlier herein, address and buffer manager 42 may sequence the contents of temporary buffer 38 for transferring its data in a coordinated fashion into sequentially addressed, memory block locations of memory 36. More specifically, address and buffer manager 42 may drive buffer 38 for outputting symbols of the ECC codeblock contained therein into symbol locations of the memory blocks of memory 36, so as to organize the symbols within the memory block in a symbol interleaved format. Address and buffer manager 42 and routing lines 39 together may coordinate the interleaved symbol transfer into the memory blocks of memory 36. Accordingly, a damaged region or block of memory 36 may corrupt a particular portion of data of an ECC codeblock, yet symbols of other portions of the ECC codeblock, as obtained from other functional memory blocks of the memory, may permit ECC processing to overcome and correct the bad data of the corrupted region, or damaged block, of memory 36.

Figure 4A:
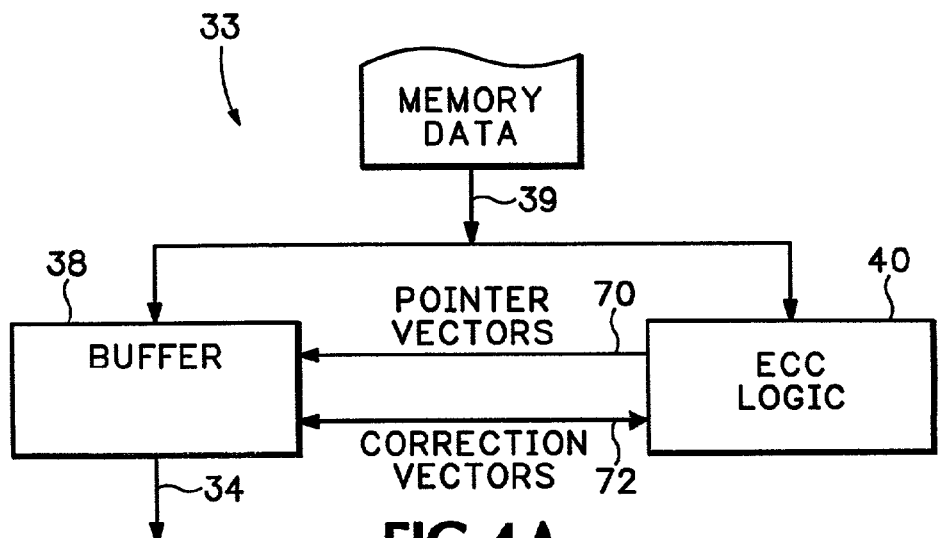
FIG. 4A is a simplified schematic diagram showing a portion of an exemplary embodiment of the present invention wherein ECC logic is operative to correct data in-situ within a buffer.

In accordance with an exemplary embodiment of the present invention, referencing FIG. 4A, the error correction is performed in-situ within buffer 38. Error correction logic 40 comprises ECC circuitry that uses an error correction code, such as, e.g., a Reed-Solomon code, and provides offset vectors 70 and correction vectors 72 to buffer 38. The offset vectors identify error locations within buffer 38, while the correction vectors designate the corrections to be applied to the contents thereof for correcting the erroneous symbols of the ECC codeblock.

Figure 4B:
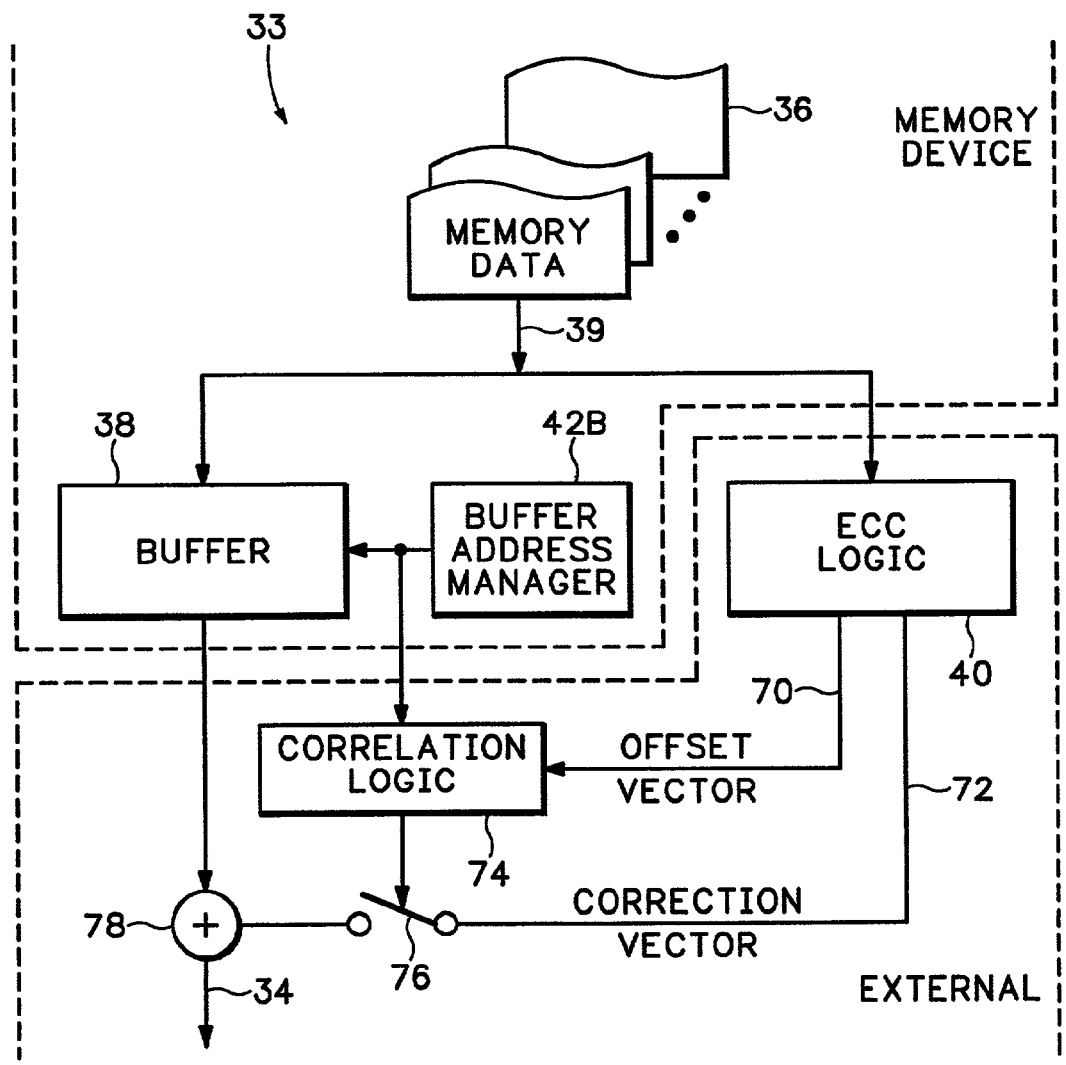
FIG. 4B is a simplified schematic diagram showing a portion of an alternative exemplary embodiment of the present invention, wherein error correction is applied to a data flow of the buffer.

In accordance with an alternative exemplary embodiment, referencing FIG. 4B, error correction may be performed during data transfer from buffer 38. Buffer 38 receives data of an ECC codeblock from memory 36 via routing lines 39. ECC logic 40 may operate upon the data of the ECC codeblock, to provide offset and correction vectors 70 and 72 for symbols of the ECC codeblock within buffer 38. As data is propagated from buffer 38, address buffer manager 42B provides information of the sequencing of the identified buffer locations to correlation logic 74. When an offset vector 70 of ECC logic 40 correlates with a sequenced location of buffer 38, correlation logic 74 enables correction vector 72 of the ECC logic 40 to be applied, via control gate 76, to correction node 78 of the data path from buffer 38 for correcting the data to be sent onto bus 34.

In accordance with one embodiment, the error correction circuitry and buffer 38 may be provided "on-board" or within data storage 33. In accordance with alternative embodiments of the present invention, portions of the error correction logic reside in external data storage 33. For example, in accordance with a particular exemplary embodiment, as illustrated by the dashed lines in FIG. 4B, ECC logic 40 may be provided external to data storage 33. Additionally, correlation logic 74, control gate 76 and correction node 78, likewise, may reside external to data storage 33.

Although, various terminologies are known for describing error correction techniques, for purposes of the present disclosure, error correction algorithms may be described as working with ECC codeblocks of symbol length "n" and as having a correction length "t", wherein t-errors of the codeblock may be correctable by the ECC process. With reference to a Reed-Solomon code, t symbols of a given codeblock of length n, may contain errors and be correctable, where $k+2t=n$. Accordingly, such codeblock of n symbols may comprise k symbols of information data and 2t symbols of correction data.

Figure 5:
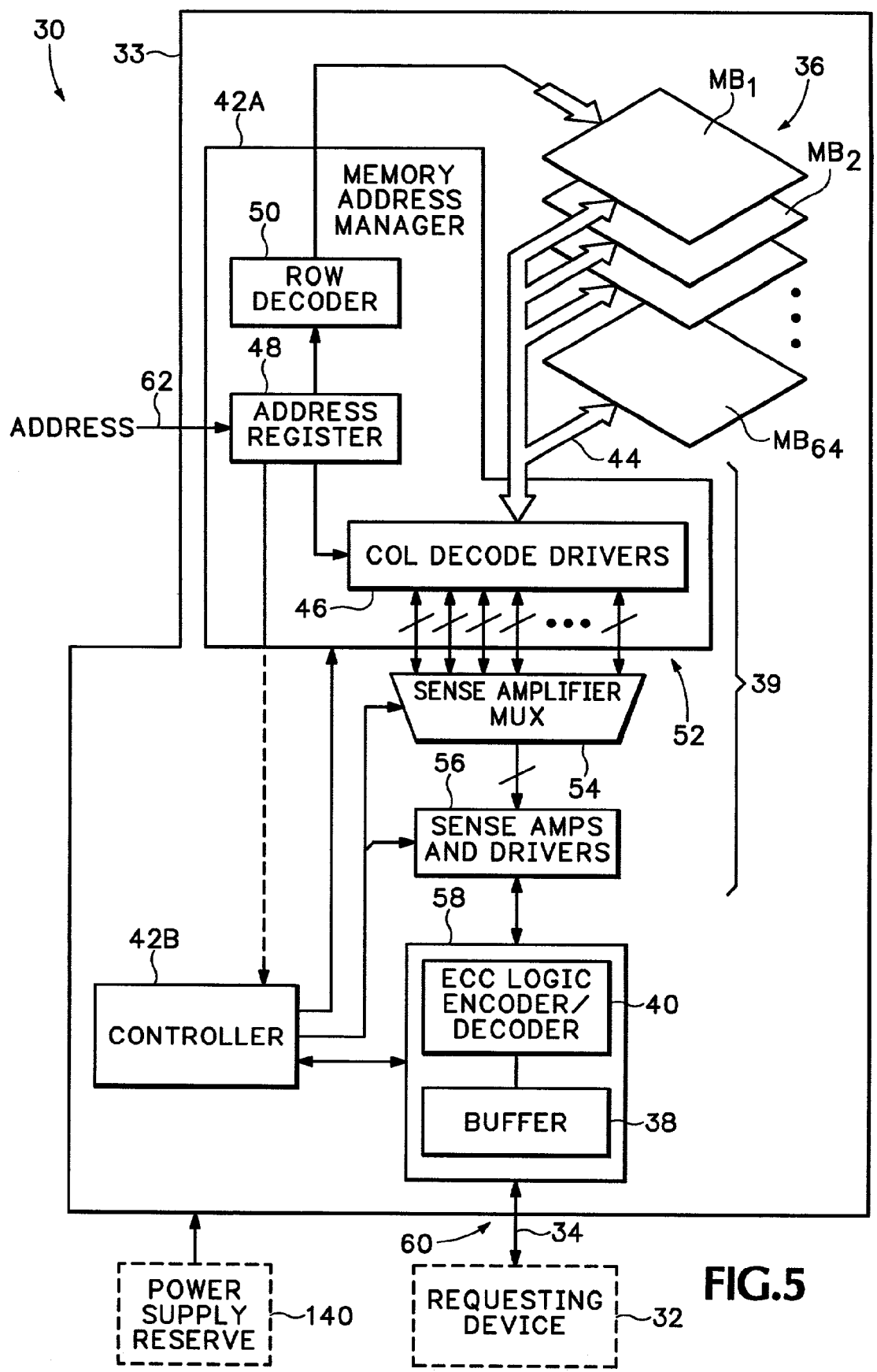
FIG. 5 is a simplified, schematic block diagram of a data processing system with data storage in accordance with an exemplary embodiment of the present invention wherein routers route data from a plurality of memory blocks to an error correction encoder/decoder.

Describing a more detailed exemplary embodiment of the present invention, with reference to FIG. 5, data processing system 30 may comprise data storage 33 coupled to a requesting device 32 via bus 34. Memory 36 comprises a plurality of memory blocks $MB_1 MB_2 \ldots MB_{64}$. Memory address manager 42A receives address information from address lines 62, and includes address register 48 which directs the address information to row decoder 50 and a column decoder and driver 46. Accordingly, memory locations of memory 36 may be read as enabled or addressed via row decoder 50 and column decoder and driver 46. Additionally, address register 48 may provide block enable signals (not shown) for enabling select memory blocks of the plurality to receive the row signals from row decoder(s) 50 and/or bit line signals from the column decoder(s) and driver(s) 46. Controller 42B may coordinate operations of memory address manager(s) 42A, sense amplifier multiplexer(s) 54 and sense amplifier(s) and drivers 56 for sensing states of, for example, ferroelectric cells of the memory blocks within memory 36. Additionally, controller 42B may sequence operations of buffer 38 of the error correction encoder/decoder(s) 58 for allowing buffer 38 to receive the sensed data of memory 36 in coordinated sequence with the addressing of memory address manager 42A for assembling symbols received from the memory blocks of memory 36 into an ECC codeblock. More specifically, routers 39, which comprises column decoder and driver 46, sense amplifier multiplexer(s) 54 and sense amplifier(s) and drivers 56, such routers 39 may facilitate symbol interlacing for distributing ECC codeblock symbols amongst the plurality of memory blocks of memory 36.

As used herein, interlacing refers to distribution of the symbols of a codeblock across different regional, or spatial groupings of cells of the memory. By such interlacing, data may be retrieved from a plurality of regions of the interlacing and may be ECC processed for overcoming and correcting corrupted data of a particular damaged region, decoder, driver, sense amplifier or spatial grouping of memory cells.

Figure 6:
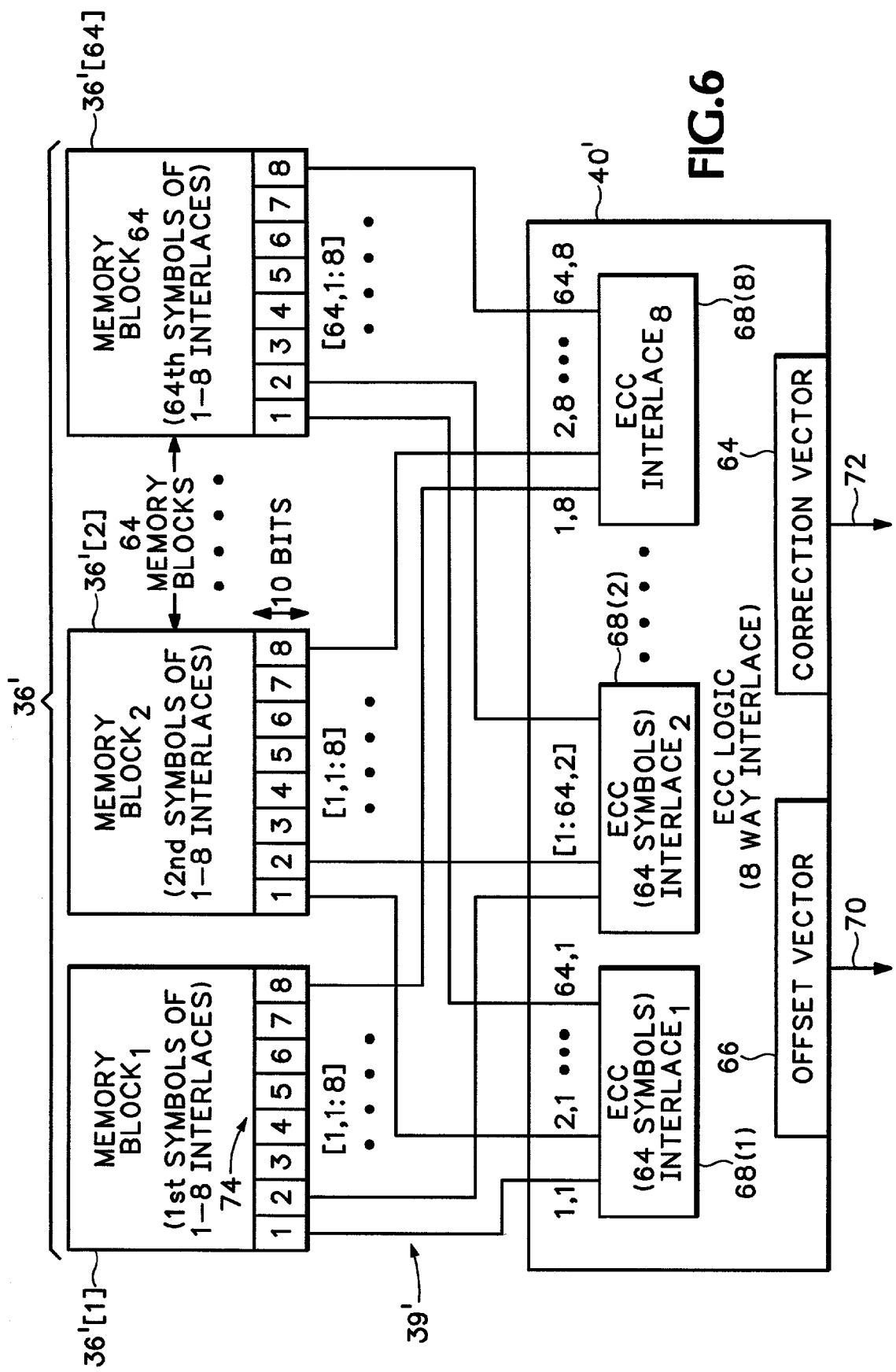
FIG. 6 is a simplified schematic diagram illustrating a portion of the present invention wherein a plurality of memory blocks are configured with routers for providing data of interlaced symbol format to separate ECC interlaces for error correction processing.

Referencing FIG. 6, a plurality of memory blocks 36'<1>, 36'<2> ... 36'<64> may comprise memory cells of separate, contiguous and addressable groupings of cells within memory 36. In accordance with a particular embodiment of the present invention, these memory blocks may represent separate memory arrays of an addressable memory space for a ferroelectric memory device.

Returning to FIG. 5, when transferring data between memory 36 and ECC encoder/decoder 58, routers 39' of FIG. 6 may transfer the contents of first location 1 of each memory block 36' to first interlace 68 (1) of ECC logic 40'. For example, the symbol from the first location of memory block 36'<1> may be routed to the first location of the interlace block 68 (1). The symbol from the first location of the second memory block 36'<2> might then be routed to the second location of the first ECC interlace 68 (1). Likewise, the symbol from the first location of the $64^{th}$ memory block 36'<64> would be routed by way of routers 39' to the $64^{th}$ location of the first ECC interlace 68 (1).

Similarly, the second locations of each of the memory blocks 36' may be routed to the second interlace 68 (2), while the subsequent sequential locations of the memory blocks may be routed to the respective third, fourth . . . eighth interlaces 68 of the ECC logic 40'. In this exemplary realization, the ECC encoder/decoder may provide an error correction algorithm for implementing an eight-way interlace from symbol distribution across 64 separate memory blocks of the memory 36. More importantly, however, channels of routers 39' may be operatively configured to transfer the data of the respective symbol locations of the memory blocks 36 to their corresponding locations of the ECC interlace blocks 68 of the error correction logic 40.

Relative to FIG. 6, the 64 separate memory blocks may have consecutive symbol locations that receive the separate interlaced symbols of the ECC codeblock associated with the eight-way interlace. Alternatively, the symbols of the ECC codeblock may be distributed across separate memory blocks per each individual symbol. In general, the symbol size and symbol distribution selections may be selected to provide efficient mappings of the symbols, through certain bus-widths of the memory, across desired regions of the memory for covering given error probability distributions thereof and, at the same time, to efficiently interface the ECC computational algorithms.

In accordance with a more specific description of an exemplary embodiment, each symbol of the error correction codeblock may comprise an eight-bit word, which may allow the ECC codeblocks a lengths of up to 256 symbols. Assuming a data (e.g., sector) size of 512 symbols and an eight-way interface, each of the interlace blocks 68 of ECC logic 40 may provide ECC computational capability for 64 data bytes (of the 512 symbols) and additional encoding information, padding and/or meta data. The computations of the interlace blocks, when combined together, may provide an overall ECC correction capability "t" for correcting, for example, 24 corrupted symbols. Therefore, 48 symbols of the ECC codeblock may be dedicated to correction, while the remaining symbols of the codeblock may be dedicated to message information. Across the eight-way interface, this would provide for 6 correction symbols per ECC block. In this fashion, for this particular exemplary embodiment, error correction logic 40 may generate up to 24 pairs of offset vectors and correction vectors for correcting up to 24 symbols that were obtained from the interlaced symbol locations of the plurality of memory blocks of memory 36.

Likewise, but in reverse manner, when writing data from the buffer, e.g. of the error correction encoder/decoder 58 of FIG. 5, data may be transferred under the control of buffer controller 42B and address manager 42A, via routers 39 into the various sequential locations of the memory blocks 36, such that the symbols of the encoded ECC codeblock may be interlaced across the plurality of memory blocks 36. For example, when writing data into the first memory block 36'<1>, referencing FIG. 6, the first symbol of ECC interlace 68 (1) may be written into the first symbol location of memory block 36'<1>. The second symbol of the first interlace 68 (1) may be written into the first location of the second memory block 36'<2>, and so on, with the $64^{th}$ symbol of the first interlace routed to the first location of the $64^{th}$ memory block 36'<64>. The second locations of each of the memory blocks 36', likewise, may receive data for symbols from the second interlace ECC codeblock 68 (2), and the eighth locations of the respective memory blocks 36' provided symbols of the eighth interlace block 68 (8). As apparent for this particular exemplary embodiment, the plurality of memory blocks 36'<1:64> and routers 39' together may be designed to facilitate the ECC symbol interlace for codeblock symbol transfers to/from the ECC logic 40, so as to facilitate its ECC data processing structures.

Returning with reference to FIG. 5, the routing of routers 39 may be affected by the configuration of column decode and drivers 46, the configuration of sense amplifier multiplexer 54, and the configuration of sense amplifiers and drivers 56. Controller 42B working together with address register 48, may drive a sequenced cooperation of these devices, when sensing data from the memory blocks, for placing the symbols of each of the symbol locations of the memory blocks to their designated ECC interlace blocks as described above.

In accordance with one particular embodiment, the various memory blocks may have their first bit locations configured for driving sense amplifiers via the column decoder and drivers 46 and sense amplifiers and drivers 54, so that the sense amplifiers may sense the first symbol locations of each of the memory blocks simultaneously for routing their data into the first ECC interlace 68 (1). Thereafter, the routers 39 may be configured via the column decoder and drivers 46 and sense amplifiers and drivers 54 and multiplexers 54, to sense the data of the second symbol locations of the plurality of memory blocks simultaneously for transfer into the 1–64 symbol locations of the second ECC interlace 68 (2). Likewise, the remaining third, fourth through the eighth symbol locations, respectively, of the plurality of memory blocks may then be transferred collectively in sequential groups into the respective third, fourth through eighth ECC interlaces.

Alternatively, a complete word grouping of symbols 1–8 from the first memory block 36'<1> may be transferred into respective first symbol locations of the $1^{st}$–$8^{th}$ interlaces 68 (1), 68 (2) . . . 68 (8). Thereafter, the symbols 1–8 of the second memory block may be transferred to the second symbol locations of each of the ECC interlaces 68 (1:8). These symbol word group readings may continue through all remaining memory blocks, until loading each of the 64 symbol locations of the eight separate interlaces 68.

Each of the above exemplary embodiments may be effective for transferring interlaced symbol data sequentially between the memory blocks and the ECC interlaces, and may, likewise, both be encompassed within the scope of the present invention.

Figure 7:
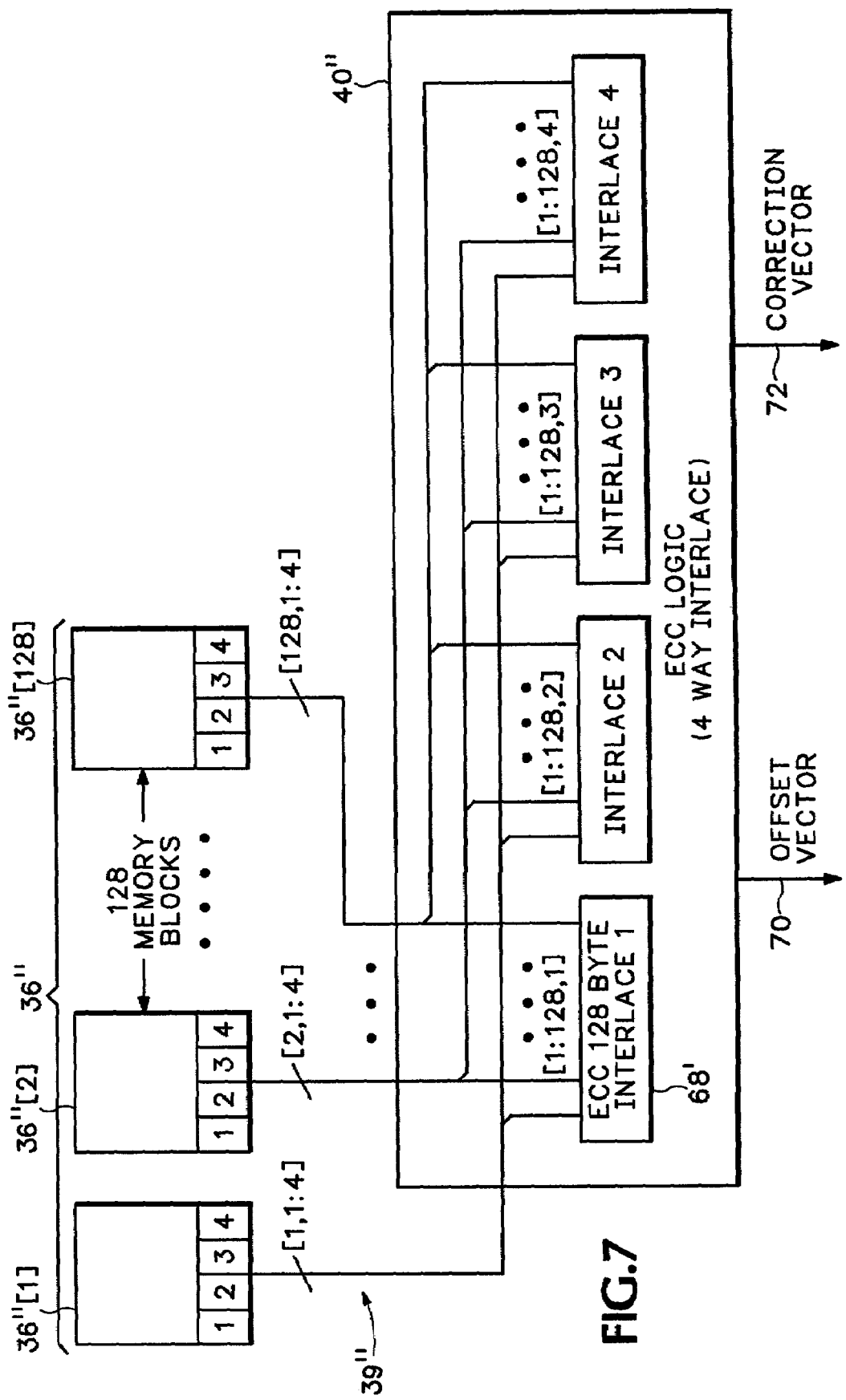
FIG. 7 is a simplified schematic diagram showing a plurality of memory blocks and ECC logic of an alternative embodiment to the present invention, wherein error correction logic is configured to provide a four-way interlace and routers facilitate interlacing of the symbols amongst the plurality of memory blocks.

The exemplary embodiment of FIG. 6 provided memory block and router architectures effective for implementing an eight-way interlace for the error correction coding algorithm for ECC logic 40. It will be understood, however, that the scope of the present invention may encompass alternative ECC logic, memory block and router architecture for distributing symbols between the memory blocks and a plurality of interlaces of the ECC logic 40'. For example, referencing FIG. 7, an alternative exemplary embodiment may comprise an architecture for implementing a four-way interlace for ECC logic 40''. Assuming, again, a sector size of 512 symbols, a four-way interlace establishes four separate ECC interlace blocks 68' of 128 symbol depth. Routers 39'' may route data for each of the ECC interlace blocks 39'' from the first, second, third and fourth symbol locations of respective $1^{st}$–$128^{th}$ memory blocks 36''<1:128>. Accordingly, routers 39'—e.g., the column decoder and drivers 46, sense amplifier multiplexer 54, and sense amplifiers and drivers 56 of FIG. 5—may be sequentially configured under the control of controller 42B and address manager 42A for facilitating such data transfer from the memory blocks 36'' (returning to FIG. 7) to the four-way interlaces of ECC logic 40''.

In operation, in accordance with one exemplary embodiment, routers 39" may route data of the first symbols from each of the 1$^{st}$ through 128$^{th}$ memory blocks 36" simultaneously for transferring these symbols to the 1–128 locations of the first ECC interlace 68'<1>. Thereafter, the column decode and drivers 46, sense amplifier multiplexer 54 and sense amplifiers and drivers 56 (of FIG. 5) may be configured for retrieving symbols of the second symbol locations of the respective 1$^{st}$–128$^{th}$ memory blocks 36" for transfer to respective 1–128 locations of the second interlace 68'<2> . . . and so forth, until filling the third and fourth interlace blocks as well. In this fashion, for this particular embodiment, the sense amplifiers of the sense amps and drivers 56 (FIG. 5) may be time multiplexed in a shared fashion across the plurality of memory blocks of memory 36", as the first through fourth symbol locations of the memory blocks 36" have their symbol data routed sequentially into the respective first through fourth interlace blocks 68'.

Assuming, for example, 32 error correction symbols, i.e. 2 t=32, then ECC logic 40" may be capable of correcting up to 16 error symbols. Accordingly, four memory blocks of the 128 separate memory blocks could be damaged without exhausting correction capabilities of the error correction logic 40".

Returning to FIG. 5, after the data has been transferred from memory blocks of memory 36 into the ECC encoder/decoder 58, ECC logic 40 may process the data, correct determined erroneous bits and symbols, and provide corrected data within buffer 38. Controller 42B may then coordinate operations of address register 48, sense amplifiers and drivers 56, sense amplifier multiplexers 54, and column decoder and drivers 46 for facilitating write-back of the error corrected data from buffer 38 into the memory blocks of memory 36. Again, as illustrated per the exemplary embodiments of FIGS. 6 and 7, the symbols from the ECC codeblocks within buffer 38 may be transferred in interlaced fashion, across the plurality of separate memory blocks—e.g., the 64 memory blocks 36'<1:64> of FIG. 6 or the 128 memory blocks 36"<1:128> of FIG. 7. Additionally, controller 42B may also coordinate transfer of the corrected data from buffer 38 to bus 34 for use by, e.g., requesting device 32.

Figure 8:
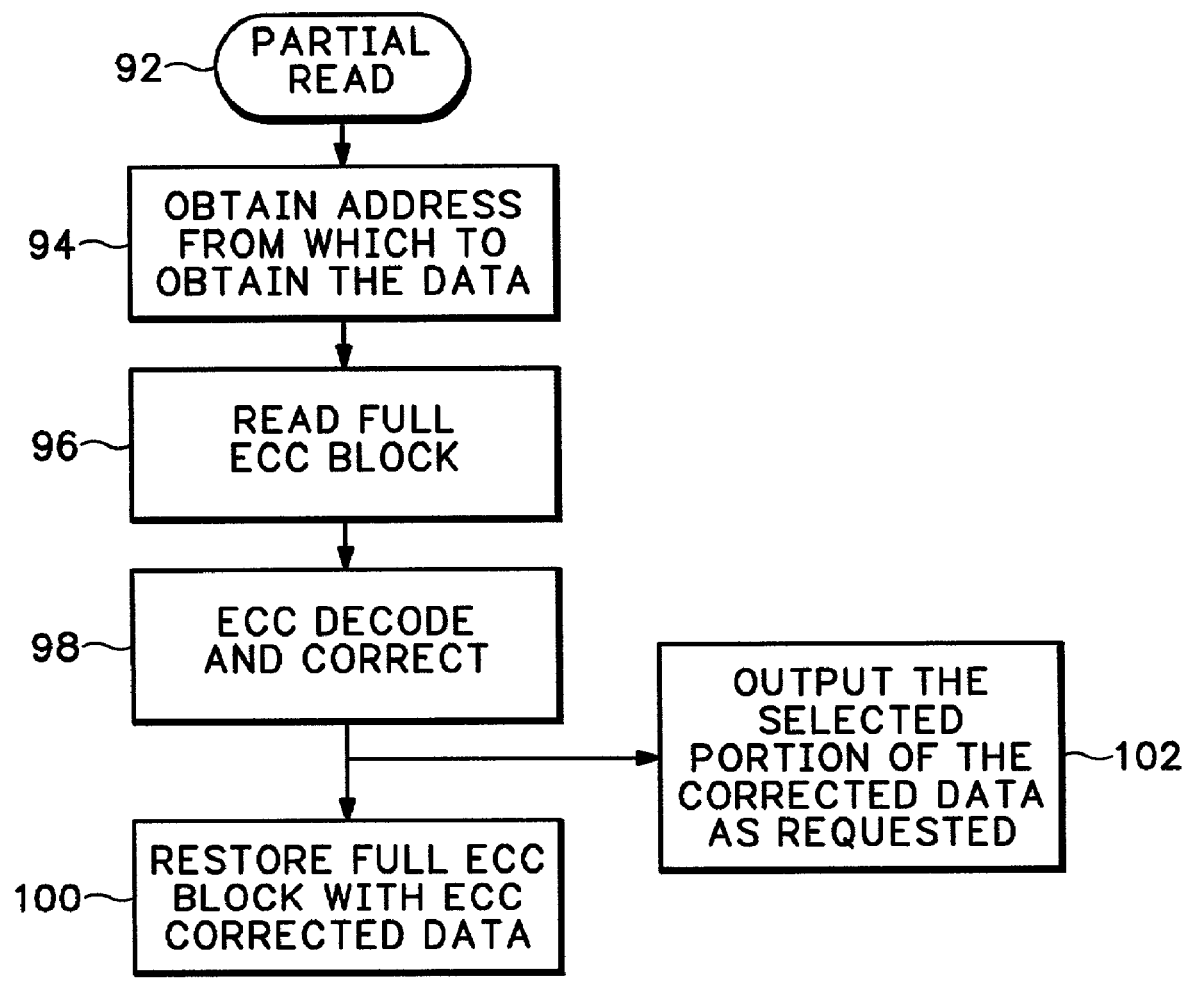
FIG. 8 is a flowchart showing partial read processes for reading a data storage in accordance with exemplary embodiments of the present invention.

Referencing FIG. 8, a read request 92 may request data of only a portion of an ECC codeblock. However, in accordance with exemplary embodiments of the present invention, a full ECC codeblock of data 96 is read from a plurality of memory blocks of memory 36 (referencing FIG. 5), which codeblock may contain data of the requested 94 memory location. The ECC codeblock may be processed 98 by ECC encoder/decoder 58 to provide ECC corrected data. Data of the error corrected codeblock, which corresponds to the requested data, may then be output 102 to the requesting device 32. Controller 42B, for example, may cooperate with address register 48 of memory address manager 42A to assure that the select portion that is sent out from the ECC codeblock corresponds to that which was initially requested by the requesting device. Additionally, upon completing correction of the ECC codeblock, controller 42B may provide a write-back 100 (FIG. 8) of the error corrected data of buffer 38 so as to restore the contents of the memory blocks that were read. Again, the symbols of the ECC codeblock may be distributed in interlaced format across the memory blocks of memory 36.

Figure 9:
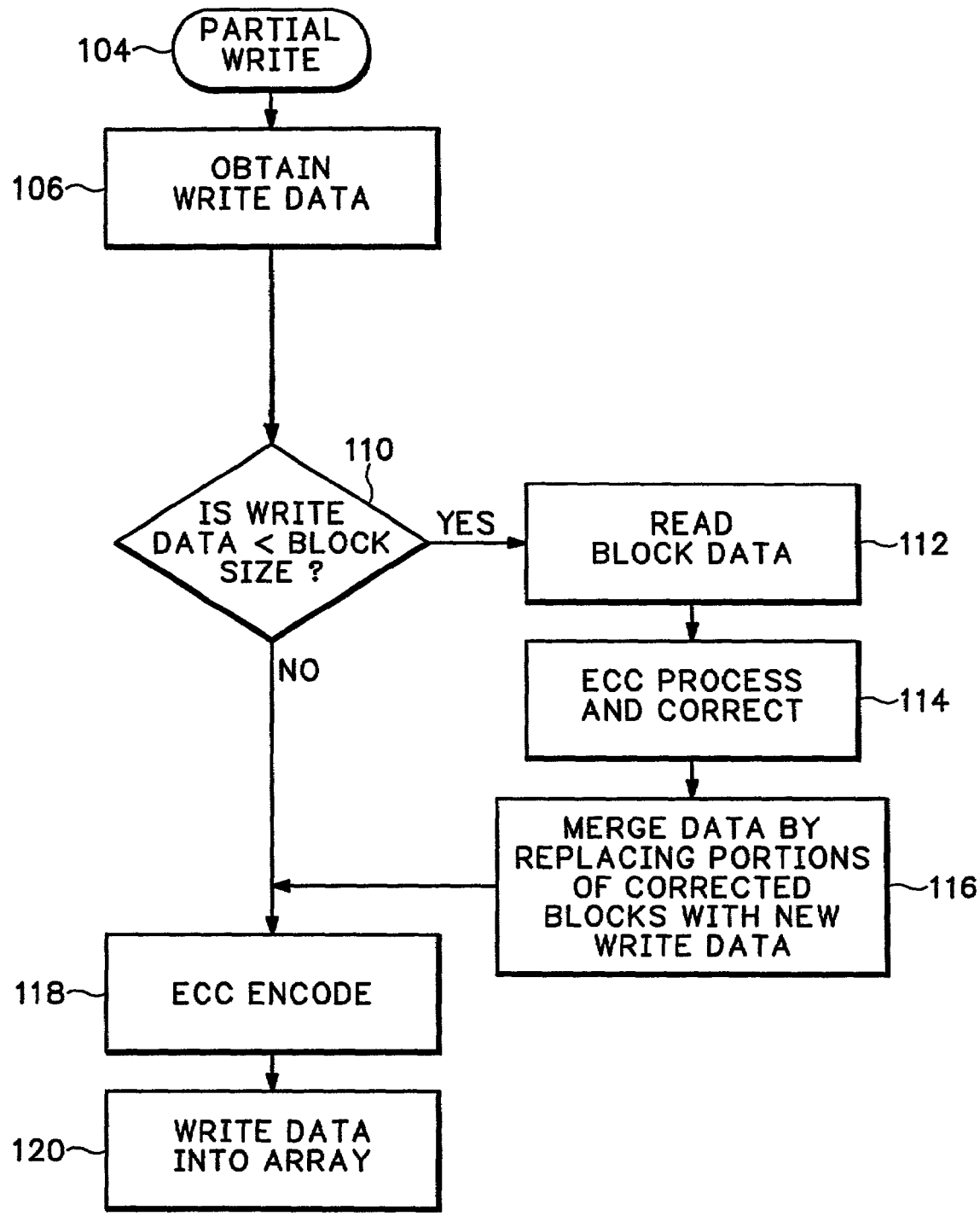
FIG. 9 is a flowchart showing write processes for writing data into a memory device in accordance with exemplary embodiments of the present invention.

Referencing FIG. 9, during operation of a write request 104, requesting device 32 (as shown in FIG. 2 or 5) may submit a write instruction to data storage 33 together with an associated write address which may be received by address register 48 of memory address manager 42A. Write data of the write request may be obtained 106 by ECC encoder/decoder 58. Upon obtaining the write data, the address and buffer manager 42 may determine if this is a partial write. Additionally, a determination 110 may be made for determining whether or not the amount of write data that is to be written is less than a full ECC codeblock.

If the data to be written within memory device 30 comprises a full size ECC codeblock, the write procedure may proceed with encoding 118 the ECC codeblock of data, and may then write 120 the data into the memory blocks of the data storage 33. Alternatively, assuming the amount of write data is less than a full ECC codeblock, then the write process may follow a different path of the partial write procedure.

Further referencing FIGS. 2, 5 and 9, upon determining 110 that the amount of data to be written is less than a full ECC codeblock, controller 42B may signal the memory address manager 42A to obtain 112 a full ECC codeblock of data from amongst the plurality of memory blocks of memory array 36, which plurality of memory blocks may encompass the memory location associated with the partial read request. Thereafter, the error correction logic 40 may operate upon the retrieved ECC codeblock for providing a corrected ECC codeblock 114. Next, the write data of the partial write request may be merged 116 with the corrected ECC codeblock, wherein select portions of the ECC codeblock which correspond to the requested write locations may be replaced with the write data. Having merged the write data with the ECC corrected codeblock, ECC encoder/decoder 58 may encode 118 the new error corrected ECC codeblock with correction information and write 120 the new encoded codeblock in symbol interleaved format into the plurality of memory blocks of memory 36 of data storage 33.

Figure 10:
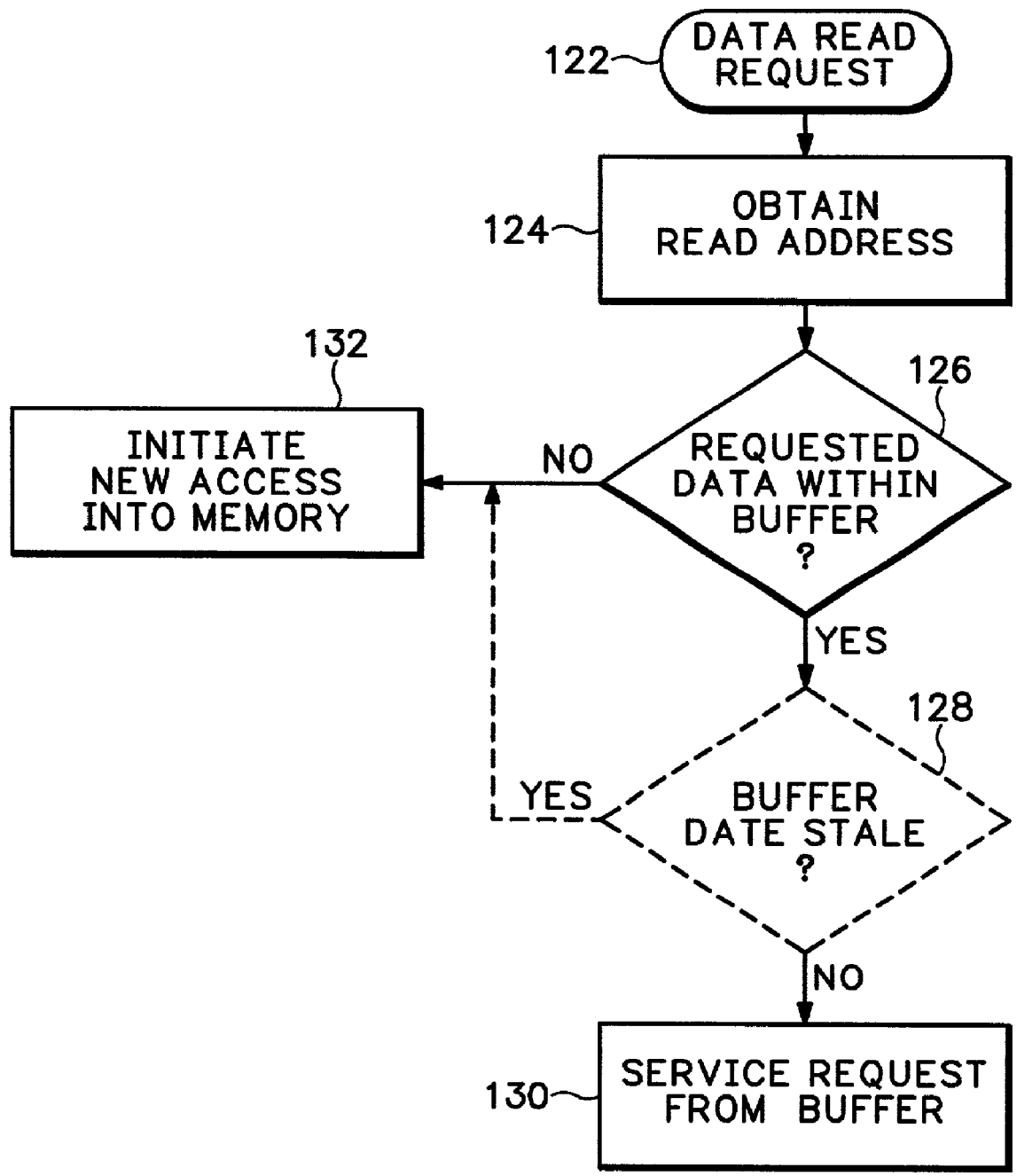
FIG. 10 is a flowchart showing a method of servicing a read request in accordance with exemplary embodiments of the present invention.

In accordance with another embodiment of the present invention, with reference to FIG. 10, a data read request 122 may be received by data storage 33 (FIGS. 2 and 5). Data storage 33 may also obtain 124 the read address which is forwarded to address register 48 of the memory address manager 42A. Before proceeding to read a complete block of data from the plurality of memory blocks of memory 36, the address register 48 sends a query to buffer 38 via controller 42B for determining 126 whether or not the read request is requesting data that has previously been ECC processed and transferred to buffer 38. If it is still present within buffer 38, then the read process may move to block 130, and the read request may be serviced with data from buffer 38 without having to initiate a full codeblock read and access of a plurality of memory blocks of memory 36. On the other hand, if the requested data is not present within the buffer, then a new access of the memory array may be pursued 132 using, for example, a read method of an exemplary embodiment of the present invention as described earlier herein.

Further referencing FIG. 10, in accordance with an alternative embodiment of the present invention, before honoring a read request with data from the buffer, a determination 128 may be made as to whether or not the buffer data might be stale. If the buffer data is determined not to be stale, then the read process may continue to step 130, and the request may be serviced by data within buffer 38. Alternatively, if it is determined that the data in buffer 38 is old, incomplete, or may risk other forms of error, then the read process may proceed to step 132 for initiating access of memory 36 and retrieval of codeblocks for ECC processing for servicing of the read request.

Returning to FIGS. 2 and 5, in accordance with a particular exemplary embodiment of the present invention, memory 36 of data storage 33 may comprise ferroelectric memory cells disposed in contiguous addressable relationship across isolated memory segments or sub-arrays. During manufacture of such memory, pin defects, for example, of the ferroelectric material that may be associated with the memory arrays may lead to a complete memory array, block or segment failure. Accordingly, in accordance with the present invention, the data of ECC codeblocks may be distributed with symbols interlaced across the plurality of separate memory blocks, segments and/or isolated sub-arrays of contiguous cells of memory 36. Accordingly, ECC decoding may obtain data for building a complete ECC codeblock from amongst the plurality and enable correction of the data even if one of the sub-arrays, segments or memory blocks may be defective.

In accordance with an exemplary, and optional aspect of the present invention, referencing FIGS. 2 and 5, a power supply reserve 140 of data processing system 30 provides data storage 33 a reserve of power for accommodating a power down or power failure. The power reserve may provide a sufficient magnitude of energy to assure completion of an error correction and write-back procedure of a memory operation despite an interruption in power during processing of a memory read or write. Accordingly, when processing system 30 loses power, the correct data of an ECC correction cycle may be restored within the memory for assuring data preservation.

Alternatively, data from buffer 38 may be written-back into the memory blocks of memory 36 immediately upon determining an interruption in power. Thereafter, upon restoring power to the data processing system, the data associated with the power-down write-back may be retrieved and ECC processed for completing error correction processing of the previously interrupted memory operation.

It will be apparent to those skilled in this art that the illustrated embodiments are exemplary and that various changes and modifications may be made thereto as become apparent upon reading the present disclosure. Accordingly, such changes and modifications are considered to fall within the scope of the appended claims.

What is claimed is:

1. A method of operating a data processing system having a processor and an integrated circuit memory device, each coupled to a bus, said method comprising:
   generating a read request at the processor;
   transmitting the read request from the processor to the memory device via the bus;
   reading multiple ferroelectric cells disposed in separate memory blocks of the memory device to obtain first data in response to the read request;
   processing the first data using an error correction algorithm that is operative with a codeblock, or codeword, comprising a plurality of symbols, the algorithm being implemented with an error correction device, the processing comprising:
   determining corrupt bits of the first data;
   correcting corrupt bits of the first data if determined by the determining, to provide second data;
   writing the multiple cells with the second data using the second data in symbol data groups of a codeblock of the error correction algorithm;
   distributing the symbols in interleaved format across an address space of a plurality of isolated, fault tolerance architected memory cells or arrays of memory cells in a plurality of the memory blocks; and
   transmitting at a least a portion of the second data on the bus to the processor to fulfill the read request, wherein the error correction algorithm is operative with a codeblock of length n and comprises an error correction capability for correcting up to t errors, the memory cells define at least Z memory blocks of the plurality, wherein n/Z is less than t, and the writing distributes the symbols in the interleaved format across the Z memory block.

2. A method according to claim 1, wherein the transmitting comprises providing both message data and correction data of the second data on the bus to fulfill the read request.

3. A method according to claim 1, wherein the plurality of memory cells comprise ferroelectric memory cells disposed in separate memory blocks; and the writing distributes the symbols of the codeblock in interleaved format across a plurality of the memory blocks.

4. A method according to claim 1, wherein the error correction algorithm employs codewords comprising message data and correction data; and
   the transmitting sends both the message data and the correction data of the second data on the bus to fulfill the read request.

5. A method of operating a memory board, comprising:
   generating a read request at an off-board processor;
   obtaining first data from a block of memory cells of memory located on the board in response to the read request;
   processing the first data with an error correction device using an algorithm operable with the block for determining corrupt bits of the first data;
   defining second data based upon the first data and any of the determined corrupt bits;
   outputting at least a portion of the second data to fulfill the read request; and
   writing the block of memory cells with the second data, wherein the memory comprises a plurality of isolated, fault tolerance architected memory blocks of contiguously grouped ferroelectric memory cells;
   the error detection algorithm being operable with a codeblock of n symbols, and implementing an M-way interlace; and
   the obtaining the data comprises retrieving data to form such codeblock from at least n/M different memory blocks of the plurality.

6. A method according to claim 5, wherein the defining the second data comprises correcting the corrupt bits of the first data if determined by the processing; and
   the outputting comprises sending out the corrected data.

7. A method according to claim 5, wherein the defining the second data comprises associating the first data with information of the corrupt bits if determined by the processing.

8. A method according to claim 5, wherein the processing and defining corrects the corrupt bits of the retrieved data of the ECC codeblock, and the writing interleaves symbols of the corrected ECC codeblock amongst the at least n/M different memory blocks.

9. A method according to claim 5, further comprising:
   obtaining a read request;
   determining if the read request is requesting data previously transferred to and present within the ECC codeblock; and servicing the read request with the data of the ECC codeblock if the determining establishes the presence therein.

10. A ferroelectric memory device comprising:

a plurality of ferroelectric cells;

a buffer operative to receive data from the plurality of ferroelectric cells; and error correction logic to process data provided to the buffer, the error correction logic operative to implement error correction processing of error correction code (ECC) codeblocks of n symbols, and capable of correcting at least t symbols;

the plurality of ferroelectric cells defining at least Z memory blocks of symbol widths sufficient to hold up to W symbols, wherein $ZW \geq n$, and $W \leq t$.

11. A ferroelectric memory device according to claim 10, further comprising an address and buffer manager operative to sequence addressing of the plurality of ferroelectric cells to transfer n symbols from the plurality of memory blocks to the buffer for an ECC codeblock.

12. A ferroelectric memory device according to claim 11, wherein the ferroelectric memory device further comprises write circuitry operative under the control of the address and buffer manager to write-back symbols of the ECC codeblock within the buffer across the plurality of memory blocks after the ECC codeblock has been processed by the error correction logic.

13. A ferroelectric memory device according to claim 12, wherein the write circuitry is operatively configurable under the control of the address and buffer manager to transfer the symbols of the ECC codeblock from the buffer in a symbol interlaced format across the plurality of memory blocks.

* * * * *